United States Patent
La (10) Patent No.: US 6,762,972 B2
(45) Date of Patent: Jul. 13, 2004

(54) SYNCHRONOUS SEMICONDUCTOR MEMORY DEVICE AND METHOD OF PROCESSING DATA THEREOF

(75) Inventor: One-Gyun La, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 137 days.

(21) Appl. No.: 10/192,898

(22) Filed: Jul. 10, 2002

(65) Prior Publication Data

US 2003/0021177 A1 Jan. 30, 2003

(30) Foreign Application Priority Data

Jul. 19, 2001 (KR) ........................................ 2001-43549

(51) Int. Cl.[7] ................................................ G11C 8/00
(52) U.S. Cl. ................. 365/233; 365/230.06; 365/220; 365/221; 365/189.01; 365/189.04
(58) Field of Search ................................ 365/207, 220, 365/221, 230.06, 233, 189.01, 189.04, 189.07, 200

(56) References Cited

U.S. PATENT DOCUMENTS 6,463,005 B2 * 10/2002 Maeda ........................ 365/233
6,515,914 B2 * 2/2003 Keeth et al. ............ 365/189.05

* cited by examiner

Primary Examiner—David Nelms
Assistant Examiner—Long Tran
(74) Attorney, Agent, or Firm—Marger Johnson & McCollom, P.C.

(57) ABSTRACT

The present invention involves a synchronous semiconductor memory device having a 4-bit prefetch mode a method of processing a data thereof, comprising first to fourth memory cell arrays each having memory cells, a serial-parallel converting means converting a plurality of 4-bit data serially applied during a write operation into a plurality of 4-bit parallel data, a data loation control means location-controlling and outputting each of the plurality of the 4-bit parallel data output from the serial-parallel converting means in response first to fourth decoding signals generated by decoding the 2-bit column address to the first to fourth memory cell arrays, by a sequential method or by an interleaving method, during the write operation, a sense amplifier amplifying a plurality of 4-bit data output from each of the first to fourth memory cell arrays, and location-controlling and outputting them in response the first to fourth decoding signals, by a sequential method or by an interleaving method, during a read operation, and a parallel-serial converting means converting and outputting a plurality of 4-bit parallel data output from the sense amplifier during a read operation into a plurality of 4-bit serial data, whereby the circuit configuration is simple.

13 Claims, 8 Drawing Sheets

| CA2,CA1 | SEQUENTIAL METHOD | CA2,CA1 | INTERLEAVING METHOD |
|---|---|---|---|
| 00 | DI1 → DF1<br>DI2 → DF2<br>DI3 → DF3<br>DI4 → DF4 | 00 | DI1 → DF1<br>DI2 → DF2<br>DI3 → DF3<br>DI4 → DF4 |
| 01 | DI1 → DF1<br>DI2 → DF2<br>DI3 → DF3<br>DI4 → DF4 | 01 | DI1 → DF1<br>DI2 → DF2<br>DI3 → DF3<br>DI4 → DF4 |
| 10 | DI1 → DF1<br>DI2 → DF2<br>DI3 → DF3<br>DI4 → DF4 | 10 | DI1 → DF1<br>DI2 → DF2<br>DI3 → DF3<br>DI4 → DF4 |
| 11 | DI1 → DF1<br>DI2 → DF2<br>DI3 → DF3<br>DI4 → DF4 | 11 | DI1 → DF1<br>DI2 → DF2<br>DI3 → DF3<br>DI4 → DF4 |

| CA2,CA1 | SEQUENTIAL METHOD | CA2,CA1 | INTERLEAVING METHOD |
|---|---|---|---|
| 00 | DS1 → DO1<br>DS2 → DO2<br>DS3 → DO3<br>DS4 → DO4 | 00 | DS1 → DO1<br>DS2 → DO2<br>DS3 → DO3<br>DS4 → DO4 |
| 01 | DS1 → DO1<br>DS2 → DO2<br>DS3 → DO3<br>DS4 → DO4 | 01 | DS1 → DO1<br>DS2 → DO2<br>DS3 → DO3<br>DS4 → DO4 |
| 10 | DS1 → DO1<br>DS2 → DO2<br>DS3 → DO3<br>DS4 → DO4 | 10 | DS1 → DO1<br>DS2 → DO2<br>DS3 → DO3<br>DS4 → DO4 |
| 11 | DS1 → DO1<br>DS2 → DO2<br>DS3 → DO3<br>DS4 → DO4 | 11 | DS1 → DO1<br>DS2 → DO2<br>DS3 → DO3<br>DS4 → DO4 |

SYNCHRONOUS SEMICONDUCTOR MEMORY DEVICE AND METHOD OF PROCESSING DATA THEREOF

This application claims benefit and priority of Korean Patent Application No. 2001-43549, filed on Jul. 19, 2001, under 35 U.S.C. §119, the entirety of which is hereby incorporated by reference.

BACKGROUND OF THE INVENTION

1. Field of the Invention

The present invention relates to a semiconductor memory device, and more particularly, to a synchronous semiconductor memory device having a 4-bit pre-fetch mode and a method of processing data thereof.

2. Description of Related Art

A synchronous semiconductor memory device has widely been used as a main memory in various industrial fields such as a desk-top computer system or a portable computer system. Such synchronous semiconductor memory devices include single data rate synchronous semiconductor memory devices and double data rate synchronous semiconductor memory devices.

The single data rate synchronous semiconductor memory device receives a datum at a rising edge of a clock signal. The double data rate synchronous semiconductor memory device receives two data at the rising edge and falling edge of a clock signal.

The double data rate synchronous semiconductor memory device includes a memory cell array having an even-number memory cell array and an odd-number memory cell array, and sequentially receives two data in one clock cycle during a write operation before writing corresponding data concurrently in the even-number memory cell array and the odd-number memory cell array. For this reason, the double data rate synchronous semiconductor memory device is called a semiconductor memory device having a 2-bit pre-fetch mode. Accordingly, compared to the single data rate semiconductor memory device, the double data rate synchronous semiconductor memory device has an advantage in that data can be input or output at higher speed.

However, in a system requiring very high-speed operation, even the double data rate semiconductor memory device cannot operate at a high enough speed.

Recently, a synchronous semiconductor memory device having a 4-bit pre-fetch mode has been developed. The synchronous semiconductor memory device having a 4-bit pre-fetch mode includes four kinds of memory cell arrays, and sequentially receives four data at the rising edge and falling edge of a clock signal.

Operation of the synchronous semiconductor memory device having a 4-bit pre-fetch mode wherein a burst length is 4 follows: a row address is decoded to select a common word line of four memory cell arrays, and a partial column address (except a lower 2-bit column address) is decoded to select corresponding bit line pairs of the four memory cell arrays. When four data are sequentially input at a rising edge and a falling edge of a clock signal, the four serial data are converted into four parallel data, and the four parallel data are input into the corresponding memory cell arrays in accordance with the lower 2-bit column address.

However, the conventional synchronous semiconductor memory device having a 4-bit pre-fetch mode has a problem in that its circuit configuration is complicated.

SUMMARY OF THE INVENTION

To overcome the problems described above, preferred embodiments of the present invention provide a synchronous semiconductor memory device having a 4-bit pre-fetch mode and a method of processing data thereof but with a simplified circuit configuration.

In order to achieve the above object, the preferred embodiments of the present invention provide a synchronous semiconductor memory device having a 4-bit pre-fetch mode, comprising: first to fourth memory cell arrays each having memory cells, the memory cells being accessed concurrently in response to a signal generated by decoding a plurality of row addresses and a partial bit column address (except a 2-bit column address); a serial-parallel converting means converting a plurality of 4-bit data serially applied during a write operation into a plurality of 4-bit parallel data; a data loation control means location-controlling and outputting each of the plurality of the 4-bit parallel data output from the serial-parallel converting means in response to first to fourth decoding signals generated by decoding the 2-bit column address to the first to fourth memory cell arrays (by a sequential method or by an interleaving method) during the write operation; a sense amplifier amplifying a plurality of 4-bit data output from each of the first to fourth memory cell arrays and location-controlling and outputting them in response the first to fourth decoding signals (by a sequential method or by an interleaving method) during a read operation; and a parallel-serial converting means converting and outputting a plurality of 4-bit parallel data output from the sense amplifier during a read operation into a plurality of 4-bit serial data.

The data location control means includes a first switching means outputting the 4-bit data "as is" in response to the first decoding signal; a second switching means outputting first and third data among the 4-bit data to the second and fourth memory cell arrays, respectively, in response to the second decoding signal and outputting second and fourth data among the 4-bit data to the third and first memory cell arrays, respectively (in response to the second decoding signal in case of the sequential method and in response to the fourth decoding signal in case of the interleaving method); a third switching means outputting the first, the third, the second, and the fourth data among the 4-bit data to the third, the first, the fourth, and the second memory cell arrays in response to the third decoding signal, respectively; and a fourth switching means outputting first and third data among the 4-bit data to the fourth and second memory cell arrays, respectively, in response to the fourth decoding signal and outputting second and fourth data among the 4-bit data to the first and third memory cell arrays, respectively, in response to the fourth decoding signal (in case of the sequential method and in response to the second decoding signal in case of the interleaving method).

Each of the first to fourth switching means includes a CMOS transmission gate.

The sense amplifier includes a first sense amplifying means amplifying bit data output from the first to fourth memory cell arrays to output a first, a second, a third, and a fourth output data in response to the first decoding signal; a second sense amplifying means amplifying bit data output from the first and third memory cell arrays to output the fourth and second output data, respectively (in response to the second decoding signal in case of the sequential method and in response to the fourth decoding signal in case of the interleaving method) and amplifying bit data output from the second and fourth memory cell arrays to output the first and third output data, respectively, in response to the second decoding signal; a third sense amplifying means amplifying bit data output from the first to fourth memory cell arrays to output the third, the fourth, the first, and the second output data in response to the first decoding signal; and a fourth sense amplifying means amplifying bit data output from the first and third memory cell arrays to output the second and fourth output data, respectively (in response to the fourth decoding signal in case of the sequential method and in response to the second decoding signal in case of the interleaving method) and amplifying bit data output from the second and fourth memory cell arrays to output the third and first output data, respectively, in response to the fourth decoding signal.

Each of the first to fourth sense amplifying means includes an amplifying circuit for amplifying data output from the corresponding memory cell array; a latch for latching data output from the amplifying circuit in response to the corresponding decoding signal during the read operation; and a driver for driving data output from the latch.

Also, another preferred example of the present invention provides a synchronous semiconductor memory device having a 4-bit pre-fetch mode, comprising: first to fourth memory cell arrays each having memory cells, the memory cells accessed concurrently in response to a signal generated by decoding a plurality of row addresses and the rest bit column address except a 2-bit column address; a serial-parallel converting means converting a plurality of 4-bit data serially applied during a write operation into a plurality of 4-bit parallel data; a data location control means outputting the 4-bit data "as is" in response to the first decoding signal, outputting first and third data among the 4-bit data to the second and fourth memory cell arrays, respectively, in response to the second decoding signal, and outputting second and fourth data among the 4-bit data to the third and first memory cell arrays, respectively, in response to the second decoding signal in case of the sequential method and in response to the fourth decoding signal in case of the interleaving method, outputting the first, the third, the second, and the fourth data among the 4-bit data to the third, the first, the fourth, and the second memory cell arrays in response to the third decoding signal, respectively, outputting first and third data among the 4-bit data to the fourth and second memory cell arrays, respectively, in response to the fourth decoding signal, and outputting second and fourth data among the 4-bit data to the first and third memory cell arrays, respectively, in response to the fourth decoding signal in case of the sequential method and in response to the second decoding signal in case of the interleaving method.

Also, another preferred example of the present invention provides a synchronous semiconductor memory device having a 4-bit pre-fetch mode, comprising: first to fourth memory cell arrays each having memory cells, the memory cells accessed concurrently in response to a signal generated by decoding a plurality of row addresses and a partial column address (except a 2-bit column address); a sense amplifier amplifying means amplifying bit data output from the first to fourth memory cell arrays to output a first, a second, a third, and a fourth output data in response to the first decoding signal, amplifying means amplifying bit data output from the first and third memory cell arrays to output the fourth and second output data, respectively (in response to the second decoding signal in case of the sequential method and in response to the fourth decoding signal in case of the interleaving method) and amplifying bit data output from the second and fourth memory cell arrays to output the first and third output data, respectively, in response to the second decoding signal, amplifying bit data output from the first to fourth memory cell arrays to output the third, the fourth, the first, and the second output data in response to the first decoding signal, and amplifying means amplifying bit data output from the first and third memory cell arrays to output the second and fourth output data, respectively (in response to the fourth decoding signal in case of the sequential method and in response to the second decoding signal in case of the interleaving method) and amplifying bit data output from the second and fourth memory cell arrays to output the third and first output data, respectively, in response to the fourth decoding signal; and a parallel-serial converting means converting and outputting a plurality of 4-bit parallel data output from the sense amplifier during a read operation into a plurality of 4-bit serial data.

Also, a synchronous semiconductor memory device having a 4-bit pre-fetch mode comprises: first to fourth memory cell arrays each having plural memory cells, the memory cells being accessed concurrently in response to a signal generated by decoding a plurality of row addresses and a partial column address (except a 2-bit column address); a serial-parallel converting means converting a plurality of 4-bit data serially applied during a write operation into a plurality of 4-bit parallel data; a data location control means outputting the 4-bit data "as is" in response to the first decoding signal, outputting first and third data among the 4-bit data to the second and fourth memory cell arrays, respectively, in response to the second decoding signal and outputting second and fourth data among the 4-bit data to the third and first memory cell arrays, respectively (in response to the second decoding signal in case of the sequential method and in response to the fourth decoding signal in case of the interleaving method), outputting the first, the third, the second, and the fourth data among the 4-bit data to the third, the first, the fourth, and the second memory cell arrays in response to the third decoding signal, respectively, outputting first and third data among the 4-bit data to the fourth and second memory cell arrays, respectively, in response to the fourth decoding signal, and outputting second and fourth data among the 4-bit data to the first and third memory cell arrays, respectively (in response to the fourth decoding signal in case of the sequential method and in response to the second decoding signal in case of the interleaving method); a sense amplifier amplifying means amplifying bit data output from the first to fourth memory cell arrays to output a first, a second, a third, and a fourth output data in response to the first decoding signal, amplifying means amplifying bit data output from the first and third memory cell arrays to output the fourth and second output data, respectively (in response to the second decoding signal in case of the sequential method and in response to the fourth decoding signal in case of the interleaving method), and amplifying bit data output from the second and fourth memory cell arrays to output the first and third output data, respectively, in response to the second decoding signal, amplifying bit data output from the first to fourth memory cell arrays to output the third, the fourth, the first, and the second output data in response to the first decoding signal, and amplifying means amplifying bit data output from the first and third memory cell arrays to output the second and fourth output data, respectively, in response to the fourth decoding signal in case of the sequential method and in response to the second decoding signal in case of the interleaving method, and amplifying bit data output from the second and fourth memory cell arrays to output the third and first output data, respectively, in response to the fourth decoding signal; and a parallel-serial converting means converting and outputting a plurality of 4-bit parallel data output from the sense amplifier during a read operation into a plurality of 4-bit serial data.

Also, another preferred example of the present invention provides a method of processing data in a synchronous semiconductor memory device having a 4-bit pre-fetch mode including first to fourth memory cell arrays each having plural memory cells, the memory cells being accessed concurrently in response to a signal generated by decoding a plurality of row addresses and a partial column address (except a 2-bit column address), the method comprising; during a write operation, converting a plurality of 4-bit data serially applied into a plurality of 4-bit parallel data; during the write operation, outputting the 4-bit data "as is" in response to the first decoding signal, outputting first and third data among the 4-bit data to the second and fourth memory cell arrays, respectively, in response to the second decoding signal, and outputting second and fourth data among the 4-bit data to the third and first memory cell arrays, respectively (in response to the second decoding signal in case of the sequential method and in response to the fourth decoding signal in case of the interleaving method), outputting the first, the third, the second, and the fourth data among the 4-bit data to the third, the first, the fourth, and the second memory cell arrays in response to the third decoding signal, respectively, outputting first and third data among the 4-bit data to the fourth and second memory cell arrays, respectively, in response to the fourth decoding signal, and outputting second and fourth data among the 4-bit data to the first and third memory cell arrays, respectively, (in response to the fourth decoding signal in case of the sequential method and in response to the second decoding signal in case of the interleaving method); during a read operation, amplifying bit data output from the first to fourth memory cell arrays to output a first, a second, a third, and a fourth output data in response to the first decoding signal, amplifying means amplifying bit data output from the first and third memory cell arrays to output the fourth and second output data, respectively (in response to the second decoding signal in case of the sequential method and in response to the fourth decoding signal in case of the interleaving method) and amplifying bit data output from the second and fourth memory cell arrays to output the first and third output data, respectively, in response to the second decoding signal, amplifying bit data output from the first to fourth memory cell arrays to output the third, the fourth, the first, and the second output data in response to the first decoding signal, and amplifying means amplifying bit data output from the first and third memory cell arrays to output the second and fourth output data, respectively (in response to the fourth decoding signal in case of the sequential method and in response to the second decoding signal in case of the interleaving method) and amplifying bit data output from the second and fourth memory cell arrays to output the third and first output data, respectively, in response to the fourth decoding signal; and during a read operation, converting means converting and outputting a plurality of 4-bit parallel data output from the sense amplifier into a plurality of 4-bit serial data.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, example of which is illustrated in the accompanying drawings.

Figure 1:
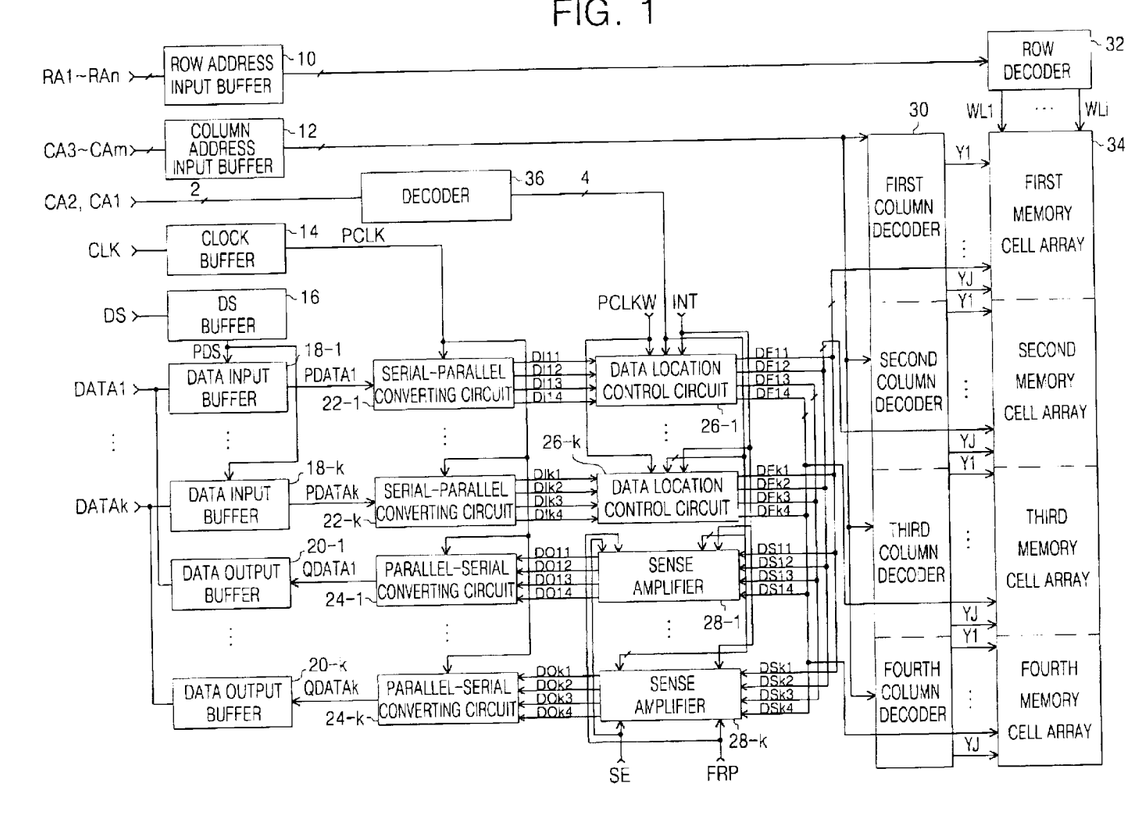
FIG. 1 is a block diagram illustrating a synchronous semiconductor memory device having a 4-bit pre-fetch mode according to an embodiment of the present invention.

FIG. 1 is a block diagram illustrating a synchronous semiconductor memory device having a 4-bit pre-fetch mode according to an embodiment of the present invention.

The synchronous semiconductor memory device having a 4-bit pre-fetch mode of FIG. 1 includes a row address input buffer 10, a column address buffer 12, a clock buffer 14, a DS buffer 16, data input buffers 18-1 to 18-k, data output buffers 20-1 to 20-k, serial-parallel converting circuits 22-1 to 22-k, parallel-serial converting circuits 24-1 to 24-k, data location control circuits 26-1 to 26-k, sense amplifiers 28-1 to 28-k, a column decoder 30, a row decoder 32, a memory cell array 34, and a decoder 36. The memory cell array 34 includes first to fourth memory cell arrays. The column decoder 30 includes first to fourth column decoders.

Operation of the synchronous semiconductor memory device having a 4-bit pre-fetch mode of FIG. 1 is described as follows.

Each of the four memory cell arrays 34 includes plural memory cells which are selected by word line selecting signals WL1 to WLi and column-selecting signals Y1 to Yj. When the corresponding memory cells are selected, each of the four memory cell arrays 34 stores data DF11, DF12, DF13 and DF14 to DFk1, DFk2, DFk3 and DFk4 during a write operation and outputs data DS11, DS12, DS13a and DS14 to DSk1, DSk2, DSk3 and DSk4 during a read operation. The row address input buffer 10 receives and buffers row addresses RA1 to Ran. The column address input buffer 12 receives and buffers column addresses CA3 to Cam. The clock buffer 14 buffers a clock signal CLK to generate a buffered clock signal PCLK. The DS buffer 16 buffers a data strobe signal DS to generate a buffered data strobe signal PDS.

The data input buffers 18-1 to 18-k buffer four serial data DATA1 to DATAk at a rising edge and a falling edge of the buffered data strobe signal PDS to generate buffered data PDATA1 to PDATAk. The data output buffers 20-1 to 20-k buffer data QDATA1 to QDATAk to generate DATA1 to DATAk. The serial-parallel converting circuits 22-1 to 22-k convert the serially input buffered data PDATA1 to PDATAk into parallel data to generate data DI11, DI12, DI13 and DI14 to DIk1, DIk2, DIk3 and DIk4. The parallel-serial converting circuits 24-1 to 24-k convert the parallel-input data DO11, DO12, DO13 and DO14 to DOk1, DOk2, DOk3 and DOk4 into the serial data to generate the data QDATA1 to QDATAk.

The data location control circuits 26-1 to 26-k control a location of the data DI11, DI12, DI13 and DI14 to DIk1, DIk2, DIk3 and DIk4 in response to a write clock signal PCLKW, an interleave control signal INT, and 2-bit column addresses CA1 and CA2 to generate the data DF11, DF12, DF13 and DF14 to DFk1, DFk2, DFk3 and DFk4. The write clock signal PCLKW is a signal generated by combining an externally applied write command WE (not shown) and the clock signal CLK.

The interleave control signal INT is a signal set by receiving a signal to determine a state of the interleave control signal INT by a mode-setting register (not shown). The sense amplifiers 28-1 to 28-k amplify the data DS11, DS12, DS13a and DS14 to DSk1, DSk2, DSk3 and DSk4 in response to a sense amplifier enable signal SE and output data amplified in response to a control signal FRP as the data DO11, DO12, DO13 and DO14 to DOk1, DOk2, DOk3 and DOk4. The decoder 36 decodes the 2-bit column addresses CA1 and CA2 to generate decoding signals CA2B1B, CA2B1, CA21B, and CA21.

Configuration and operation part of the circuits except the data location control circuits 26-1 to 26-k and the sense amplifiers 28-1 to 28-k are well known to the ordinary skilled person in the art, and thus their description is omitted to avoid a redundancy.

Configuration and operation of the data location control circuits 26-1 to 26-k are described below.

Table 1 shows methods of receiving data according to the input 2-bit column addresses by a sequential method and an interleaving method.

TABLE 1

| Externally input address CA2 and CA1 | Sequential method | | | Externally input address CA2 and CA1 | Interleaving method | | |
|---|---|---|---|---|---|---|---|
| D1 | D2 | D3 | D4 | D1 | D2 | D3 | D4 |
| 00 | 01 | 10 | 11 | 00 | 01 | 10 | 11 |
| 01 | 10 | 11 | 00 | 01 | 00 | 11 | 10 |
| 10 | 11 | 00 | 01 | 10 | 11 | 00 | 01 |
| 11 | 00 | 01 | 10 | 11 | 10 | 01 | 00 |

As can be seen in Table 1, when the externally input addresses CA2 and CA1 are "00" and data are input by the sequential method or the interleaving method, data D1 are stored in a first memory cell array, data D2 are stored in a second memory cell array, data D3 are stored in a third memory cell array, and data D4 are stored in a fourth memory cell array. When the externally input addresses CA2 and CA1 are "01" and data are input by the sequential method, the data D1 are stored in the second memory cell array, the data D2 are stored in the third memory cell array, the data D3 are stored in the fourth memory cell array, and the data D4 are stored in the first memory cell array.

When the externally input addresses CA2 and CA1 are "01" and data are input by the interleaving method, the data D1 are stored in the second memory cell array, the data D2 are stored in the first memory cell array, the data D3 are stored in the fourth memory cell array, and the data D4 are stored in the third memory cell array.

Figure 2:
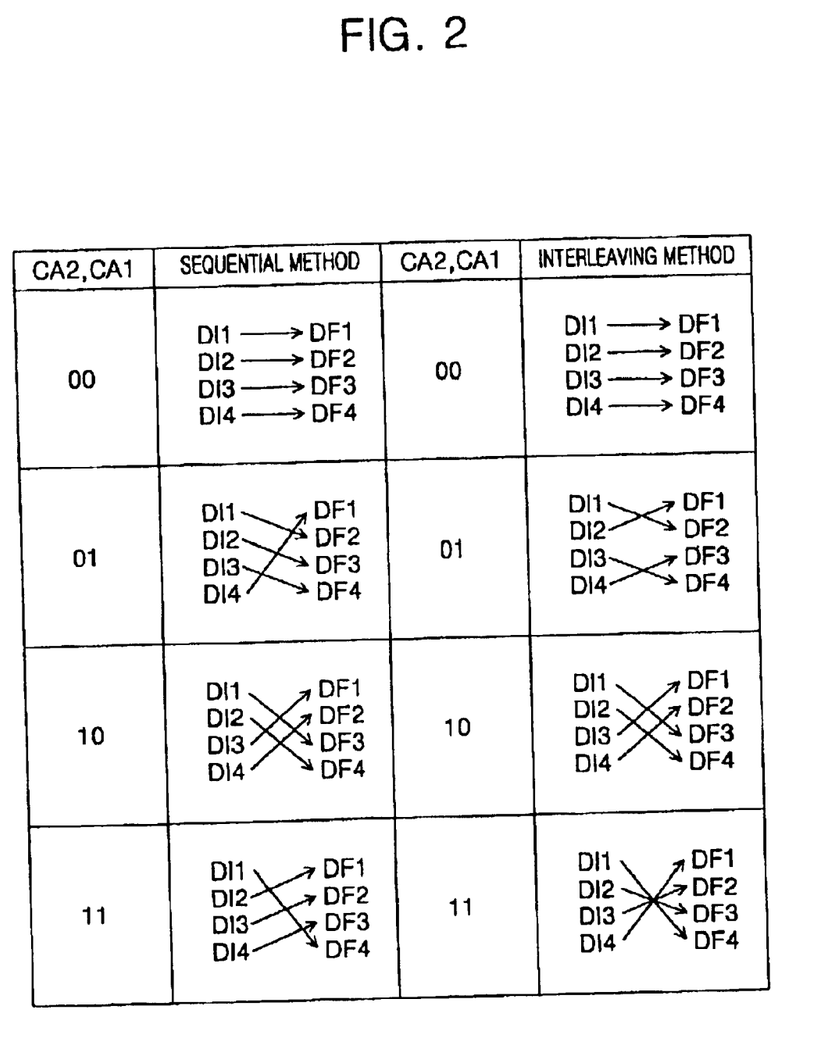
FIG. 2 is a table illustrating a data location control operation of the data location control circuit of FIG. 1.

FIG. 2 is a table illustrating a data location control operation of the data location control circuit.

In the case of both the sequential method and the interleaving method, when the externally input column addresses CA2 and CA1 are "00", the data location control circuit receives data DI1, DI2, DI3, and DI4 to output data DF1, DF2, DF3, and DF4. In the case of both the sequential method and the interleaving method, when the externally input column addresses CA2 and CA1 are "10", the data location control circuit receives data DI1, DI2, DI3, and DI4 to output data DF3, DF4, DF1, and DF2.

In the case of the sequential method, when the externally input column addresses CA2 and CA1 are "01", the data location control circuit receives data DI1, DI2, DI3, and DI4 to output data DF2, DF3, DF4, and DF1. In the case of the interleaving method, when the externally input column addresses CA2 and CA1 are "01", the data location control circuit receives data DI1, DI2, DI3, and DI4 to output data DF2, DF1, DF4, and DF3.

In the case of the sequential method, when the externally input column addresses CA2 and CA1 are "11", the data location control circuit receives data DI1, DI2, DI3, and DI4 to output data DF4, DF1, DF2, and DF3. In the case of the interleaving method, when the externally input column addresses CA2 and CA1 are "01", the data location control circuit receives data DI1, DI2, DI3, and DI4 to output data DF4, DF3, DF2, and DF1.

As can be seen in FIG. 2, the sequential method and the interleaving method differ in a data transmission path of the data DI2 and DI4 in the case that the column addresses CA2 and CA1 are "01" and "11". However, the other cases have the same data transmission path according to a change of the column addresses CA2 and CA1.

Figure 3:
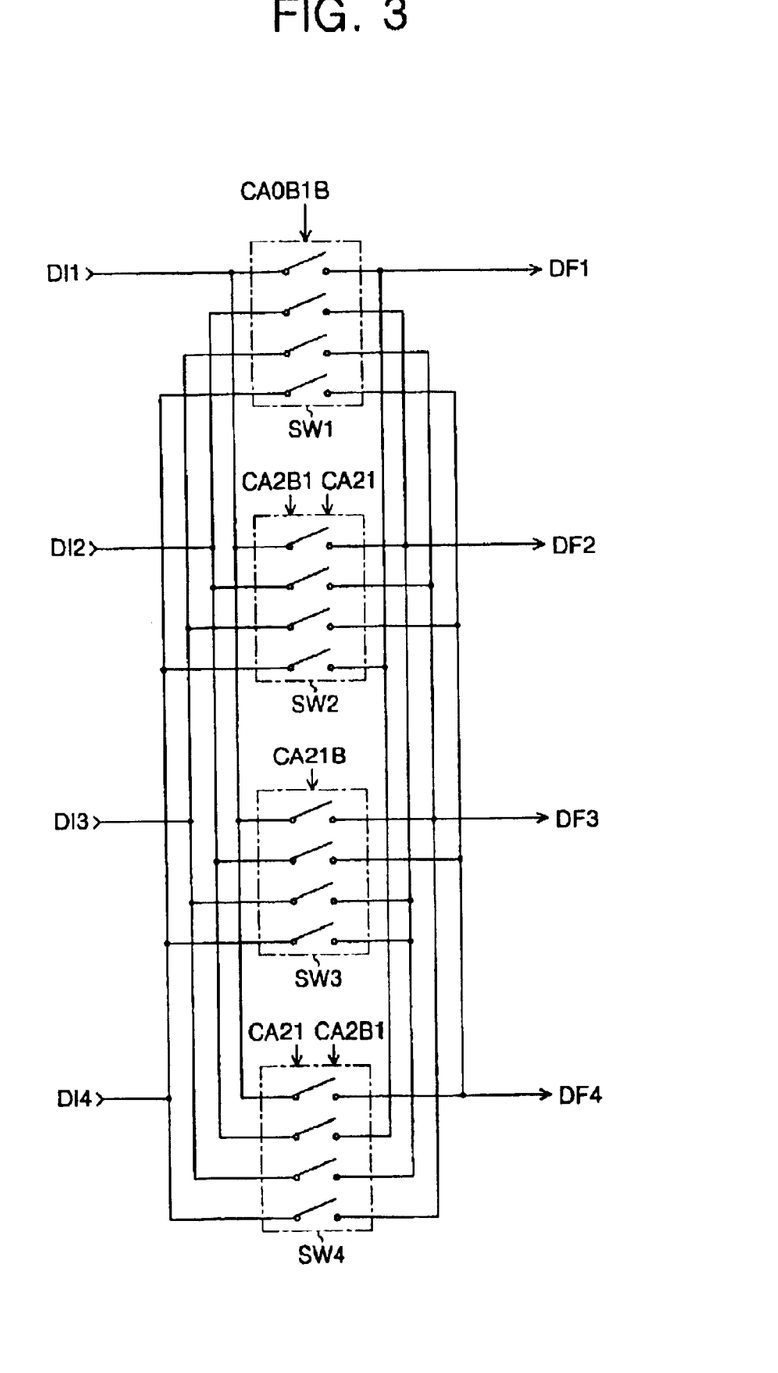
FIG. 3 is a schematic circuit diagram illustrating the data location control circuit of FIG. 1.

FIG. 3 is a schematic circuit diagram illustrating the data location control circuit. The data location control circuit of FIG. 3 includes switches SW1 to SW4.

The switch SW1 receives the data DI1, DI2, DI3, and DI4 to output the data DF1, DF2, DF3, and DF4 in response to the decoding signal CA2B1B, in case of both the sequential method and the interleaving method.

The switch SW2 receives the data DI1, DI2, DI3, and DI4 to output the data DF2, DF3, DF4, and DF1 in response to the decoding signal CA2B1B, in case of the sequential method. In case of the interleaving method, the switch SW2 receives the data DI1 and DI3 to output the data DF2 and DF4 in response to the decoding signal CA2B1 and receives the data DI2 and DI4 to output the data DF3 and DF1 in response to the decoding signal CA21. The switch SW3 receives the data DI1, DI2, DI3, and DI4 to output the data DF1, DF2, DF3, and DF4 in response to the decoding signal CA21B, in case of both the sequential method and the interleaving method.

The switch SW4 receives the data DI1, DI2, DI3, and DI4 to output the data DF4, DF1, DF2, and DF3 in response to the decoding signal CA21, in case of the sequential method. In case of the interleaving method, the switch SW4 receives the data DI1 and DI3 to output the data DF4 and DF2 in response to the decoding signal CA21 and receives the data DI2 and DI4 to output the data DF1 and DF3 in response to the decoding signal CA2B1.

Figure 4:
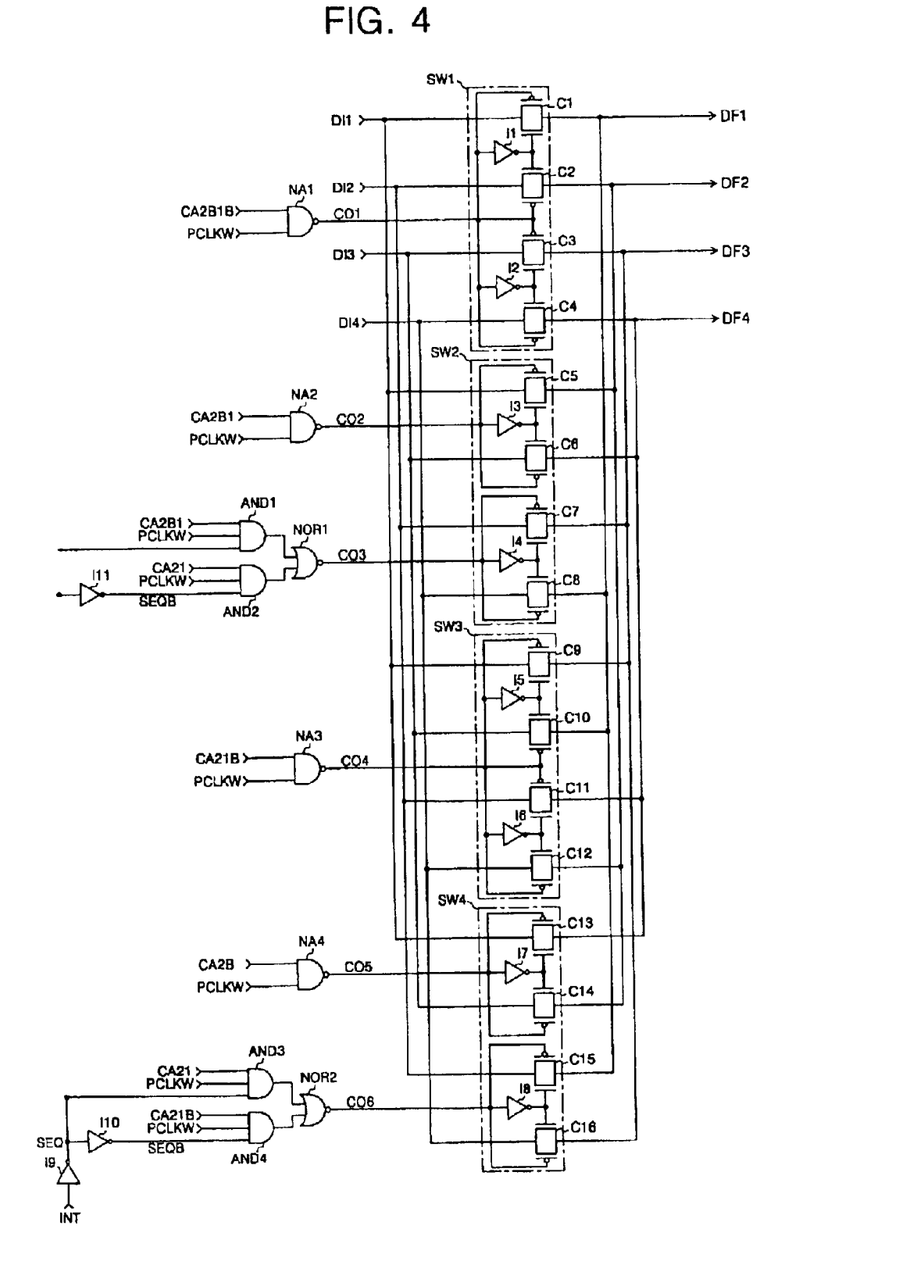
FIG. 4 is a detail circuit diagram illustrating the data location control circuit of FIG. 1.

FIG. 4 is a detail circuit diagram illustrating the data location control circuit. The data location control circuit of FIG. 4 includes switches SW1 to SW4, NAND gates NA1 to NA4, AND gates AN1 to AN4, NOR gates NOR1 and NOR2, and inverters I9 to I11.

The switch SW1 includes CMOS transmission gates C1 to C4 and inverters I1 and I2. The switch SW2 includes CMOS transmission gates C5 to C8 and inverters I3 and I4. The switch SW3 includes CMOS transmission gates C9 to C12 and inverters I5 and I6. The switch SW4 includes CMOS transmission gates C13 to C16 and inverters I7 and I8.

Operation of the data location control circuit of FIG. 4 is described below.

The NAND gate NA1 generates a control signal CO1 by NANDing the write clock signal PCLKW and the address CA2B1B. The COM transmission gates C1 to C4 receive the data DI1, DI2, DI3, and DI4 to output the data DF1, DF2, DF3, and DF4, respectively, in response to the control signal CO1 having a logic "low" level. The NAND gate NA2 generates a control signal CO2 by NANDing the write clock signal PCLKW and the address CA2B1. The CMOS transmission gates C5 and C6 receive the data DI1 and DI3 to output DF2 and DF4 in response to the control signal CO2 having a logic "low" level. The AND gate AND1 ANDs the decoding signal CA2B1, the write clock signal PCLKW and a sequential control signal SEQ. The AND gate AND2 ANDs the decoding signal CA21, the write clock signal PCLKW and a sequential control signal SEQ. The NOR gate NOR1 generates a control signal CO3 by NORing output signals of the AND gates AND1 and AND2. The CMOS transmission gates C7 and C8 receive the data DI2 and DI4 to output the data DF3 and DF1, respectively, in response to the control signal CO3 having a logic "low" level.

The NAND gate NA3 generates a control signal C04 by NANDing the write clock signal PCLKW and the decoding signal CA21B. The COM transmission gates C9 to C12 receive the data DI1, DI2, DI3, and DI4 to output the data DF3, DF1, DF4, and DF2, respectively. The NAND gate NA4 generates a control signal CO5 by NANDing the write clock signal PCLKW and the decoding signal CA21. The AND gate AND3 ANDs the decoding signal CA21, the write clock signal PCLKW and the sequential control signal SEQ. The AND gate AND4 ANDs the decoding signal CA2B1, the write clock signal PCLKW and the sequential control signal SEQ. The NOR gate NOR2 generates a control signal CO6 by NORing output signals of the AND gates AND3 and AND4.

As described above, the input data can be transferred to the corresponding memory cell array by the data location control circuit of FIG. 1.

Figure 5:
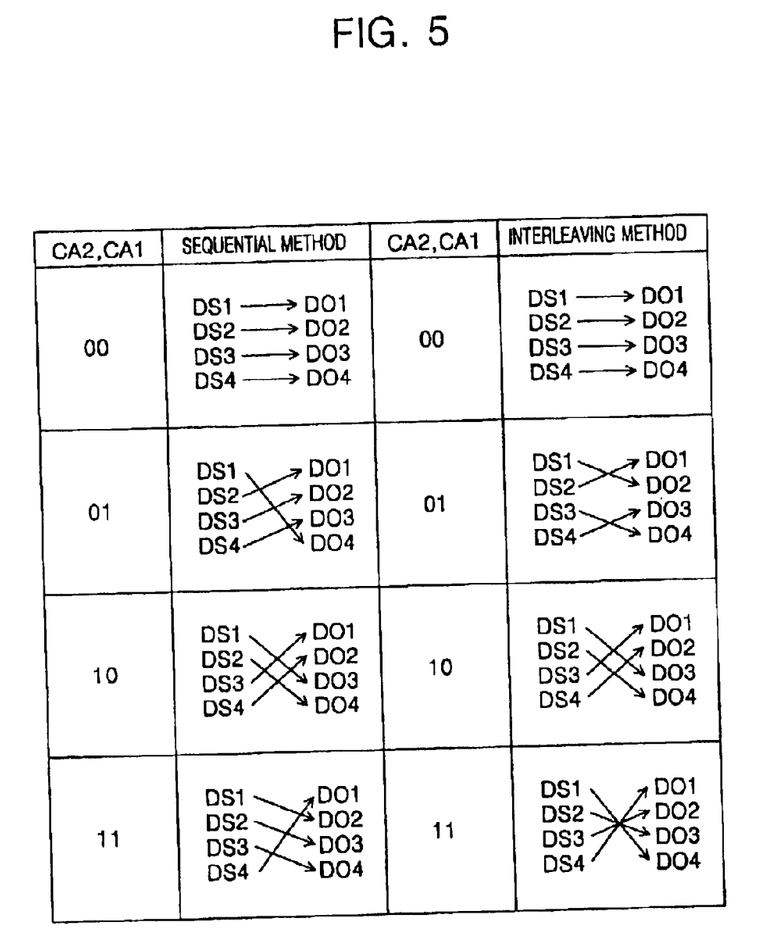
FIG. 5 is a table illustrating a data location control operation of the sense amplifier of FIG. 1.

FIG. 5 is a table illustrating a data location control operation of the sense amplifier. In the case of both the sequential method and the interleaving method, when the externally input column addresses CA2 and CA1 are "00" and "10", the data transferring path is equal to that of FIG. 2.

In the case of the sequential method, when the externally input column addresses CA2 and CA1 are "01", the sense amplifier receives the data DS1, DS2, DS3, and DS4 to output the data DO4, DO1, DO2, and DO3. In the case of the interleaving method, when the externally input column addresses CA2 and CA1 are "01", the sense amplifier receives the data DS1, DS2, DS3, and DS4 to output the data DO2, DO1, DO4, and DO3.

In the case of the sequential method, when the externally input column addresses CA2 and CA1 are "11", the data location control circuit receives data DS1, DS2, DS3, and DS4 to output data DI2, DI3, DI4, and DI1. In the case of the interleaving method, when the externally input column addresses CA2 and CA1 are "11", the data location control circuit receives data DI1, DI2, DI3, and DI4 to output data DI4, DI3, DI2, and DI1.

Figure 6:
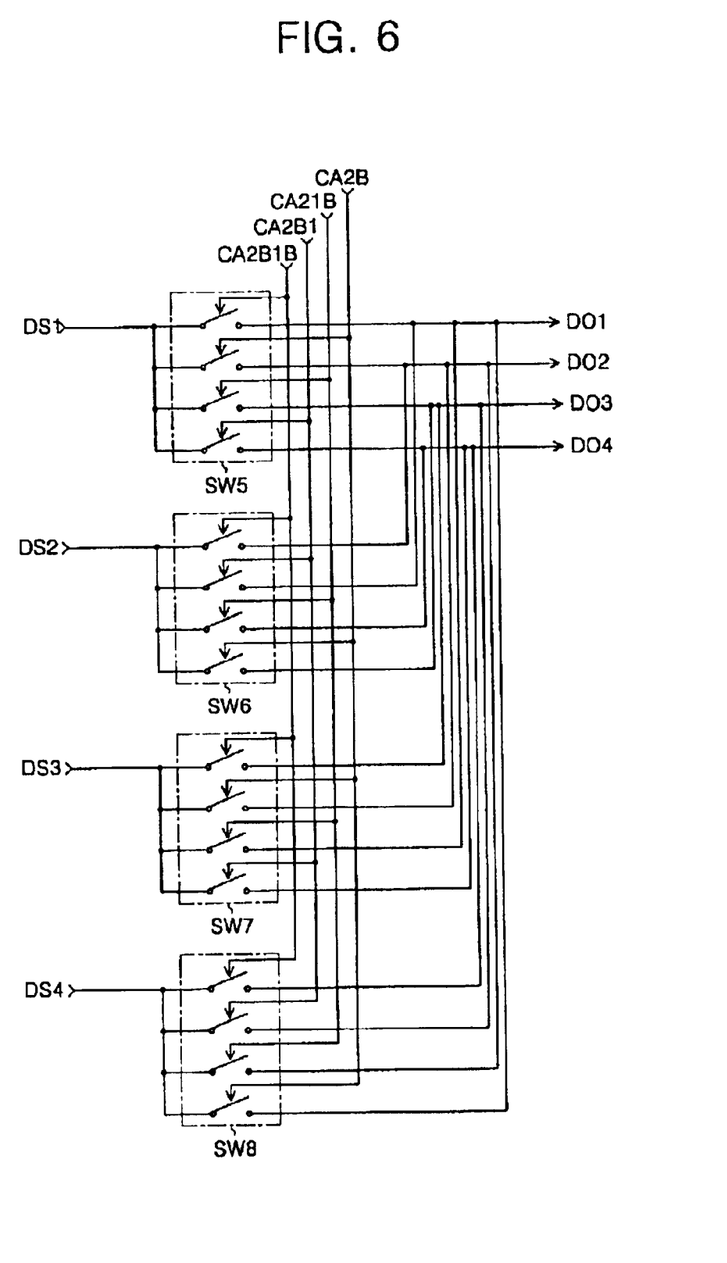
FIG. 6 is a schematic circuit diagram illustrating the sense amplifier of FIG. 1.

As can be seen in FIG. 5, the sequential method and the interleaving method differ in a data transmission path of the data DS1 and DS3 in the case that the column addresses CA2 and CA1 are "01" and "11". However, the other cases have the same data transmission path according to a change of the column addresses CA2 and CA1. FIG. 6 is a schematic circuit diagram illustrating the sense amplifier. The sense amplifier of FIG. 6 includes switches SW6 to SW8.

The switches SW5 to SW8 receive the data DS1, DS2, DS3, and DS4 to output the data DO1, DO2, DO3, and DO4 in response to the decoding signal CA2B1B, in case of both the sequential method and the interleaving method.

The switches SW5 to SW8 receive the data DS2 and DS4 to output the data DO1 and DO3 in response to the decoding signal CA2B1, in case of both the sequential method and the interleaving method.

The switches SW5 to SW8 receive the data DS1 and DS3 to output the data DO4 and DO2 in response to the decoding signal CA2B1, in case of the sequential method, and receives the data DS1 and DS3 to output the data DO2 and DO4 in response to the decoding signal CA2B1, in case of the interleaving method.

The switches SW5 to SW8 receive the data DS1, DS2, DS3, and DS4 to output the data DO3, DO4, DO1, and DO2 in response to the decoding signal CA21B, in case of both the sequential method and the interleaving method.

The switches SW5 to SW8 receive the data DS2 and DS4 to output the data D03 and DO1 in response to the decoding signal CA21, in case of both the sequential method and the interleaving method.

The switches SW5 to SW8 receive the data DS1 and DS3 to output the data DO2 and DO4 in response to the decoding signal CA21, in case of the sequential method, and receives the data DS1 and DS3 to output the data DO4 and DO2 in response to the decoding signal CA21, in case of the interleaving method.

As can be seen in FIG. 6, the sequential method and the interleaving method differ in a data transmission path of the data DS1 and DS3 in the case that the column addresses CA2 and CA1 are "01" and "11". However, the other cases have the same data transmission path according to a change of the column addresses CA2 and CA1.

Figure 7:
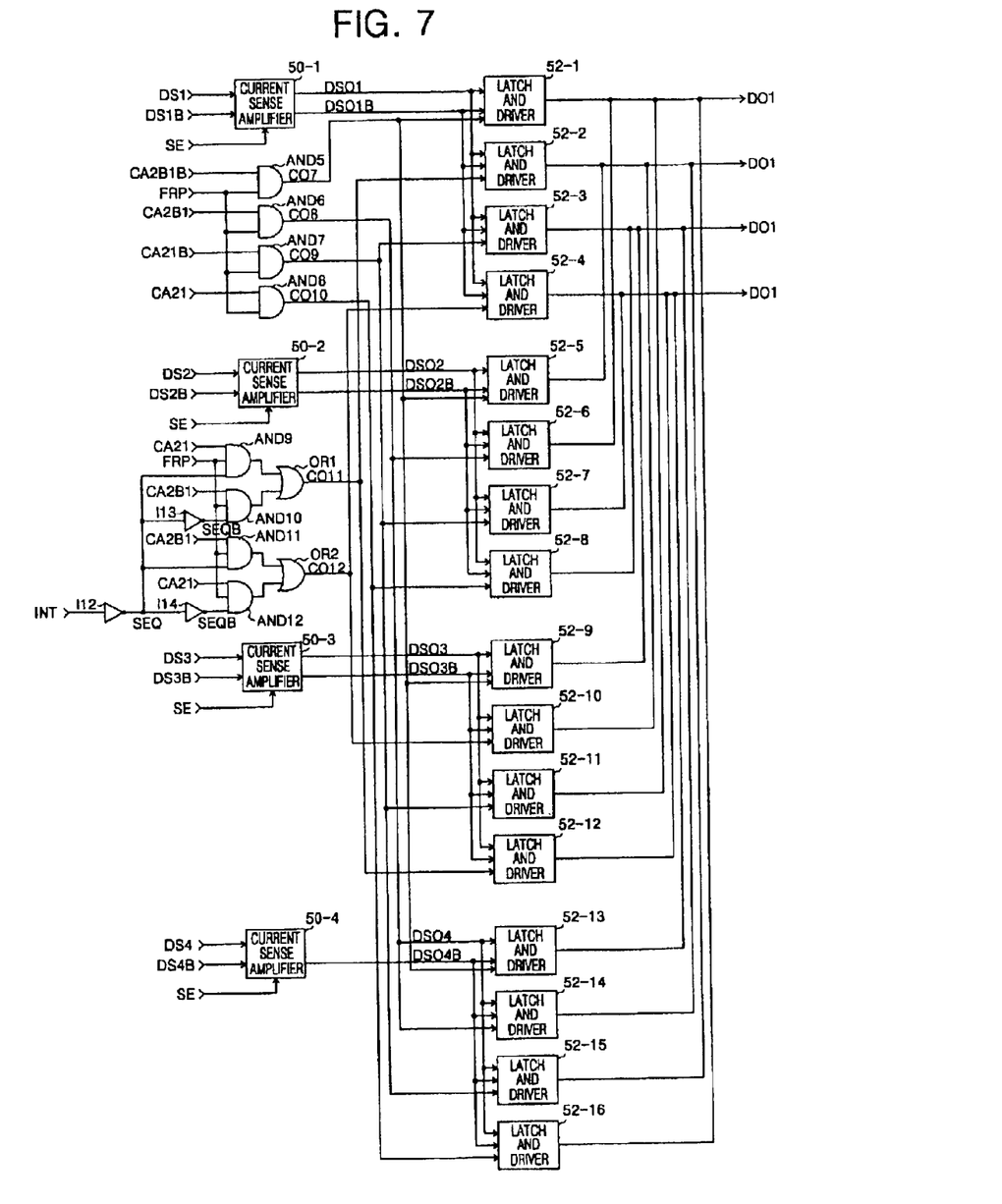
FIG. 7 is a circuit diagram illustrating the sense amplifier of FIG. 1.

FIG. 7 is a circuit diagram illustrating the sense amplifier. The sense amplifier of FIG. 7 includes current sense amplifiers 50-1 to 50-4, latch and drivers 52-1 to 52-16, AND gates AND5 to AND12, OR gates OR1 and OR2, and inverters 112 to 114.

Operation of the sense amplifier of FIG. 7 is described below.

The current sense amplifiers 50-1 to 50-4 amplify a current difference of data DS 1 and DS1B, DS2 and DS2B, DS3 and DS3B, and DS4 and DS4B to generate data DSO1 and DSO1B, DSO2 and DSO2B, DSO3 and DSO3B, and DSO4 and DSO4B, respectively. The AND gate AND5 generates a control signal CO7 by ANDing the decoding signal CA2B1B and a control signal FRP. The AND gate AND5 generates a control signal CO7 by ANDing the decoding signal CA2B1B and a control signal FRP. The AND gate AND6 generates a control signal CO8 by ANDing the decoding signal CA2B1 and the control signal FRP. The AND gate AND7 generates a control signal CO9 by ANDing the decoding signal CA21B and the control signal FRP. The AND gate AND8 generates a control signal CO11 by ANDing the decoding signal CA21 and the control signal FRP. The AND gate AND9 ANDs the decoding signal CA21, the control signal FRP and the sequential control signal SEQ. The AND gate AND10 ANDs the decoding signal CA2B1, the control signal FRP and the sequential control signal SEQ. The OR gate OR1 generates a control signal CO11 by ORing output signals of the AND gates AND9 and AND10. The AND gate AND11 ANDs the decoding signal CA2B1, the control signal FRP and the sequential control signal SEQ. The AND gate AND12 ANDs the decoding signal CA21, the control signal FRP and the sequential control signal SEQ. The OR gate OR2 generates a control signal CO12 by ORing output signals of the AND gates AND11 and AND12.

The latch and drivers 52-1, 52-5, 52-9, and 52-13 latch and drive the data DSO1 and DSO1B, DSO2 and DSO2B, DSO3 and DSO3B, and DSO4 and DSO4B to output data DO1, DO2, DO3, DO4, respectively, in response to the control signal CO7. The latch and drivers 52-2 and 52-10 latch and drive the data DSO1 and DSO1B and DSO3 and DSO3B to output the data DO4 and DO2, respectively, in response to the control signal CO11. The latch and drivers 52-6 and 52-14 latch and drive the data DSO2 and DSO2B, and DSO4 and DSO4B to output the data DO1 and DO3, respectively, in response to the control signal CO8. The latch and drivers 52-3, 52-7, 52-11, and 52-15 latch and drive the data DSO1 and DSO1B, DSO2 and DSO2B, DSO3 and DSO3B, and DSO4 and DSO4B to output data DO3, DO4, DO1, DO2, respectively, in response to the control signal CO9. The latch and drivers 52-4 and 52-12 latch and drive the data DSO1 and DSO1B, and DSO3 and DSO3B to output the data DO2 and DO4, respectively, in response to the control signal CO12. The latch and drivers 52-8 and 52-16 latch and drive the data DSO2 and DSO2B, and DSO4 and DSO4B to output the data DO3 and DO1, respectively, in response to the control signal CO10.

In FIG. 7, even though a line that outputs the data DO1 to DO4 includes a plurality of contact points, since just one among a plurality of signals is output, there does not occur a signal collision.

The sense amplifiers of FIG. 7 current-amplify the data DS1 to DS4 and change an order of the data DS1 to DS4 to output them in response to the decoding signal, i.e., the externally column address CA2 and CA1, in case of both the sequential method and the interleaving method, by the same method as described above.

Figure 8:
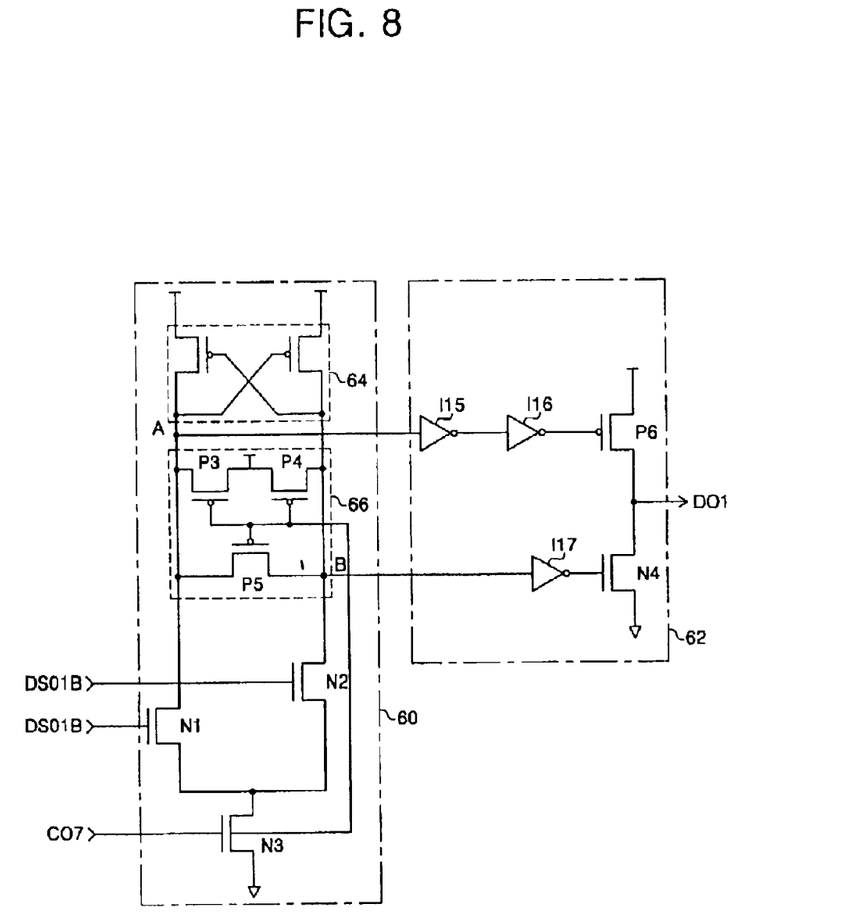
FIG. 8 is a circuit diagram illustrating the latch and driver of FIG. 7.

FIG. 8 is a circuit diagram illustrating the latch and driver 52-1 of FIG. 7. The latch and driver includes the latch 60 and the driver 62. The latch 60 includes a PMOS latch 64 having PMOS transistors P1 and P2, a pre-charge circuit 66 having PMOS transistors P3 to P5, and NMOS transistors N1 to N3. The driver 62 includes inverters I15 to I17, a PMOS transistor P6, and an NMOS transistor N4.

Operation of the latch and driver of FIG. 8 is described below.

When the control signal CO7 has a logic "low" level, the PMOS transistors P3 to P5 are all turned on so that nodes A and B are pre-charged to a predetermined level. At this time, a pre-charge level is between a power voltage and a ground voltage. When the control signal CO7 transits to a logic "high" level, the NMOS transistor N3 is turned on so that operation of the latch 60 is enabled.

In this state, when the data DSO1B having a logic "high" level and the data DSO1 having a logic "low" level are applied, the NMOS transistor N2 is turned on, so that the node A is transited to a logic "high" level and the node B is transited to a logic "low" level. The PMOS latch 64 latches a state of the nodes A and B in response to signals of the nodes A and B. The inverters I15 and I16 buffer a signal having a logic "high" level at the node A to generate a signal having a logic "high" level, and the inverter I17 inverts a signal having a logic "low" level to generate a signal having a logic "high" level. The PMOS transistor P6 is turned off, and the NMOS transistor N4 is turned on, so that the data DO1 having a logic "low" level is generated. On the other hand, when the data DSO1B having a logic "low" level and the data DSO1 having a logic "high" level are applied, the data DO1 having a logic "high" level is generated.

As described herein before, a synchronous semiconductor memory device having a 4-bit pre-fetch mode and a method of processing a data thereof in which a circuit configuration is simple can be achieved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A synchronous semiconductor memory device having a 4-bit prefetch mode, comprising:

first to fourth memory cell arrays each having memory cells, the memory cells accessed concurrently in response to a signal generated by decoding a plurality of row addresses and a partial column address except a 2-bit column address;

a serial-parallel converting means converting a plurality of 4-bit data serially applied during a write operation into a plurality of 4-bit parallel data;

a data location control means location-controlling and outputting each of the plurality of the 4-bit parallel data output from the serial-parallel converting means in response to first to fourth decoding signals generated by decoding the 2-bit column address to the first to fourth memory cell arrays, by a sequential method or by an interleaving method, during the write operation;

a sense amplifier amplifying a plurality of 4-bit data output from each of the first to fourth memory cell arrays, and location-controlling and outputting the amplified data in response the first to fourth decoding signals, by a sequential method or by an interleaving method, during a read operation; and a parallel-serial converting means converting and outputting a plurality of 4-bit parallel data output from the sense amplifier during a read operation into a plurality of 4-bit serial data.

2. The device of claim 1, wherein the data location control means includes:

a first switching means outputting the 4-bit data in response to the first decoding signal;

a second switching means outputting first and third data among the 4-bit data to the second and fourth memory cell arrays, respectively, in response to the second decoding sigal, and outputting second and fourth data among the 4-bit data to the third and first memory cell arrays, respectively, in response to the second decoding signal in case of the sequential method and in response to the fourth decoding signal in case of the interleaving method;

a third switching means outputting the first, the third, the second, and the fourth data among the 4-bit data to the third, the first, the fourth, and the second memory cell arrays in response to the third decoding signal, respectively; and a fourth switching means outputting first and third data among the 4-bit data to the fourth and second memory cell arrays, respectively, in response to the fourth decoding signal, and outputting second and fourth data among the 4-bit data to the first and third memory cell arrays, respectively, in response to the fourth decoding signal in case of the sequential method and in response to the second decoding signal in case of the interleaving method.

3. The device of claim 2, wherein each of the first to fourth switching means includes a CMOS transmission gate.

4. The device of claim 1, wherein the sense amplifier includes:

a first sense amplifying means amplifying bit data output from the first to fourth memory cell arrays to output a first, a second, a third, and a fourth output data in response to the first decoding signal;

a second sense amplifying means amplifying bit data output from the first and third memory cell arrays to output the fourth and second output data, respectively, in response to the second decoding signal in case of the sequential method and in response to the fourth decoding signal in case of the interleaving method, and amplifying bit data output from the second and fourth memory cell arrays to output the first and third output data, respectively, in response to the second decoding signal;

a third sense amplifying means amplifying bit data output from the first to fourth memory cell arrays to output the third, the fourth, the first, and the second output data in response to the first decoding signal; and a fourth sense amplifying means amplifying bit data output from the first and third memory cell arrays to output the second and fourth output data, respectively, in response to the fourth decoding signal in case of the sequential method and in response to the second decoding signal in case of the interleaving method, and amplifying bit data output from the second and fourth memory cell arrays to output the third and first output data, respectively, in response to the fourth decoding signal.

5. The device of claim 4, wherein each of the first to fourth sense amplifying means includes:

an amplifying circuit for amplifying data output from the corresponding memory cell array;

a latch for latching data output from the amplifying circuit in response to the corresponding decoding signal during the read operation; and a driver for driving data output from the latch.

6. A synchronous semiconductor memory device having a 4-bit pre-fetch mode, comprising:

first to fourth memory cell arrays each having memory cells, the memory cells accessed concurrently in response to a signal generated by decoding a plurality of row addresses and a partial bit column address except a 2-bit column address;

a serial-parallel converting means converting a plurality of 4-bit data serially applied during a write operation into a plurality of 4-bit parallel data;

a data location control means outputting the 4-bit data in response to the first decoding signal, outputting first and third data among the 4-bit data to the second and fourth memory cell arrays, respectively, in response to the second decoding signal, and outputting second and fourth data among the 4-bit data to the third and first memory cell arrays, respectively, in response to the second decoding signal in case of the sequential method and in response to the fourth decoding signal in case of the interleaving method, outputting the first, the third, the second, and the fourth data among the 4-bit data to the third, the first, the fourth, and the second memory cell arrays in response to the third decoding signal, respectively, outputting first and third data among the 4-bit data to the fourth and second memory cell arrays, respectively, in response to the fourth decoding signal, and outputting second and fourth data among the 4-bit data to the first and third memory cell arrays, respectively, in response to the fourth decoding signal in case of the sequential method and in response to the second decoding signal in case of the interleaving method.

7. The device of claim 6, wherein the data location control means includes:

a first switching means outputting the 4-bit data in response to the first decoding signal;

a second switching means outputting first and third data among the 4-bit data to the second and fourth memory cell arrays, respectively, in response to the second decoding signal, and outputting second and fourth data among the 4-bit data to the third and first memory cell arrays, respectively, in response to the second decoding signal in case of the sequential method and in response to the fourth decoding signal in case of the interleaving method;

a third switching means outputting the first, the third, the second, and the fourth data among the 4-bit data to the third, the first, the fourth, and the second memory cell arrays in response to the third decoding signal, respectively; and a fourth switching means outputting first and third data among the 4-bit data to the fourth and second memory cell arrays, respectively, in response to the fourth decoding signal, and outputting second and fourth data among the 4-bit data to the first and third memory cell arrays, respectively, in response to the fourth decoding signal in case of the sequential method and in response to the second decoding signal in case of the interleaving method.

8. The device of claim 7, wherein each of the first to fourth switching means includes a CMOS transmission gate.

9. A synchronous semiconductor memory device having a 4-bit pre-fetch mode, comprising:

first to fourth memory cell arrays each having memory cells, the memory cells accessed concurrently in response to a signal generated by decoding a plurality of row addresses and the rest bit column address except a 2-bit column address;

a sense amplifier amplifying means amplifying bit data output from the first to fourth memory cell arrays to output a first, a second, a third, and a fourth output data in response to the first decoding signal, amplifying means amplifying bit data output from the first and third memory cell arrays to output the fourth and second output data, respectively, in response to the second decoding signal in case of the sequential method and in response to the fourth decoding signal in case of the interleaving method, and amplifying bit data output from the second and fourth memory cell arrays to output the first and third output data, respectively, in response to the second decoding signal, amplifying bit data output from the first to fourth memory cell arrays to output the third, the fourth, the first, and the second output data in response to the first decoding signal, and amplifying means amplifying bit data output from the first and third memory cell arrays to output the second and fourth output data, respectively, in response to the fourth decoding signal in case of the sequential method and in response to the second decoding signal in case of the interleaving method, and amplifying bit data output from the second and fourth memory cell arrays to output the third and first output data, respectively, in response to the fourth decoding signal; and a parallel-serial converting means converting and outputting a plurality of 4-bit parallel data output from the sense amplifier during a read operation into a plurality of 4-bit serial data.

10. The device of claim 9, wherein the sense amplifier includes:
 a first sense amplifying means amplifying bit data output from the first to fourth memory cell arrays to output a first, a second, a third, and a fourth output data in response to the first decoding signal;
 a second sense amplifying means amplifying bit data output from the first and third memory cell arrays to output the fourth and second output data, respectively, in response to the second decoding signal in case of the sequential method and in response to the fourth decoding signal in case of the interleaving method, and amplifying bit data output from the second and fourth memory cell arrays to output the first and third output data, respectively, in response to the second decoding signal;
 a third sense amplifying means amplifying bit data output from the first to fourth memory cell arrays to output the third, the fourth, the first, and the second output data in response to the first decoding signal; and
 a fourth sense amplifying means amplifying bit data output from the first and third memory cell arrays to output the second and fourth output data, respectively, in response to the fourth decoding signal in case of the sequential method and in response to the second decoding signal in case of the interleaving method, and amplifying bit data output from the second and fourth memory cell arrays to output the third and first output data, respectively, in response to the fourth decoding signal.

11. The device of claim 10, wherein each of the first to fourth sense amplifying means includes:
 an amplifying circuit for amplifying data output from the corresponding memory cell array;
 a latch for latching data output from the amplifying circuit in response to the corresponding decoding signal during the read operation; and
 a driver for driving data output from the latch.

12. A synchronous semiconductor memory device having a 4-bit pre-fetch mode, comprising:
 first to fourth memory cell arrays each having memory cells, the memory cells accessed concurrently in response to a signal generated by decoding a plurality of row addresses and a partial bit column address except a 2-bit column address;
 a serial-parallel converting means converting a plurality of 4-bit data serially applied during a write operation into a plurality of 4-bit parallel data;
 a data location control means outputting the 4-bit data in response to the first decoding signal, outputting first and third data among the 4-bit data to the second and fourth memory cell arrays, respectively, in response to the second decoding signal, and outputting second and fourth data among the 4-bit data to the third and first memory cell arrays, respectively, in response to the second decoding signal in case of the sequential method and in response to the fourth decoding signal in case of the interleaving method, outputting the first, the third, the second, and the fourth data among the 4-bit data to the third, the first, the fourth, and the second memory cell arrays in response to the third decoding signal, respectively, outputting first and third data among the 4-bit data to the fourth and second memory cell arrays, respectively, in response to the fourth decoding signal, and outputting second and fourth data among the 4-bit data to the first and third memory cell arrays, respectively, in response to the fourth decoding signal in case of the sequential method and in response to the second decoding signal in case of the interleaving method;
 a sense amplifier amplifying means amplifying bit data output from the first to fourth memory cell arrays to output a first, a second, a third, and a fourth output data in response to the first decoding signal, amplifying means amplifying bit data output from the first and third memory cell arrays to output the fourth and second output data, respectively, in response to the second decoding signal in case of the sequential method and in response to the fourth decoding signal in case of the interleaving method, and amplifying bit data output from the second and fourth memory cell arrays to output the first and third output data, respectively, in response to the second decoding signal, amplifying bit data output from the first to fourth memory cell arrays to output the third, the fourth, the first, and the second output data in response to the first decoding signal, and amplifying means amplifying bit data output from the first and third memory cell arrays to output the second and fourth output data, respectively, in response to the fourth decoding signal in case of the sequential method and in response to the second decoding signal in case of the interleaving method, and amplifying bit data output from the second and fourth memory cell arrays to output the third and first output data, respectively, in response to the fourth decoding signal; and
 a parallel-serial converting means converting and outputting a plurality of 4-bit parallel data output from the sense amplifier during a read operation into a plurality of 4-bit serial data.

13. A method of processing data in a synchronous semiconductor memory device having a 4-bit pre-fetch mode including first to fourth memory cell arrays each having memory cells, the memory cells accessed concurrently in response to a signal generated by decoding a plurality of row addresses and a partial bit column address except a 2-bit column address, the method comprising;
 during a write operation, converting a plurality of 4-bit data serially applied into a plurality of 4-bit parallel data;
 during the write operation, outputting the 4-bit data in response to the first decoding signal, outputting first and third data among the 4-bit data to the second and fourth memory cell arrays, respectively, in response to the second decoding signal, and outputting second and fourth data among the 4-bit data to the third and first memory cell arrays, respectively, in response to the second decoding signal in case of the sequential method and in response to the fourth decoding signal in case of the interleaving method, outputting the first, the third, the second, and the fourth data among the 4-bit data to the third, the first, the fourth, and the second memory cell arrays in response to the third decoding signal, respectively, outputting first and third data among the 4-bit data to the fourth and second memory cell arrays, respectively, in response to the fourth decoding signal, and outputting second and fourth data among the 4-bit data to the first and third memory cell arrays, respectively, in response to the fourth decoding signal in case of the sequential method and in response to the second decoding signal in case of the interleaving method;

during a read operation, amplifying bit data output from the first to fourth memory cell arrays to output a first, a second, a third, and a fourth output data in response to the first decoding signal, amplifying means amplifying bit data output from the first and third memory cell arrays to output the fourth and second output data, respectively, in response to the second decoding signal in case of the sequential method and in response to the fourth decoding signal in case of the interleaving method, and amplifying bit data output from the second and fourth memory cell arrays to output the first and third output data, respectively, in response to the second decoding signal, amplifying bit data output from the first to fourth memory cell arrays to output the third, the fourth, the first, and the second output data in response to the first decoding signal, and amplifying means amplifying bit data output from the first and third memory cell arrays to output the second and fourth output data, respectively, in response to the fourth decoding signal in case of the sequential method and in response to the second decoding signal in case of the interleaving method, and amplifying bit data output from the second and fourth memory cell arrays to output the third and first output data, respectively, in response to the fourth decoding signal; and during a read operation, converting means converting and outputting a plurality of 4-bit parallel data output from the sense amplifier into a plurality of 4-bit serial data.

* * * * *

UNITED STATES PATENT AND TRADEMARK OFFICE
CERTIFICATE OF CORRECTION

PATENT NO. : 6,762,972 B1
DATED : July 13, 2004
INVENTOR(S) : La

It is certified that error appears in the above-identified patent and that said Letters Patent is hereby corrected as shown below:

Column 8,
Line 58, "inverters 13 and 14." should read -- inverters I3 and I4. --.

Column 10,
Line 37, "inverters 112 and 114." should read -- inverters I12 and I14. --.
Line 53, "signal CO11 by" should read -- signal CO10 by --.

Signed and Sealed this

Fourteenth Day of June, 2005

JON W. DUDAS
*Director of the United States Patent and Trademark Office*